(12) United States Patent
Shen et al.

(10) Patent No.: US 9,240,436 B2
(45) Date of Patent: Jan. 19, 2016

(54) DISPLAY PANEL AND PIXEL ARRAY THEREOF

(71) Applicant: AU Optronics Corporation, Hsin-Chu (TW)

(72) Inventors: Shih-Ming Shen, Hsin-Chu (TW); Meng-Ting Lee, Hsin-Chu (TW); Hsueh-Yen Yang, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 14/504,937

(22) Filed: Oct. 2, 2014

(65) Prior Publication Data

US 2015/0311264 A1    Oct. 29, 2015

(30) Foreign Application Priority Data

Apr. 25, 2014 (CN) .......................... 2014 1 0171459
Jul. 25, 2014 (CN) .......................... 2014 1 0358992

(51) Int. Cl.
H01L 27/32  (2006.01)
H01L 51/52  (2006.01)

(52) U.S. Cl.
CPC ........ *H01L 27/3218* (2013.01); *H01L 27/3213* (2013.01); *H01L 27/3216* (2013.01); *H01L 27/3276* (2013.01)

(58) Field of Classification Search
None
See application file for complete search history.

(56) References Cited

U.S. PATENT DOCUMENTS

| 8,159,508 B2 | 4/2012 | Lee |
| 2011/0012820 A1* | 1/2011 | Kim et al. ................ 345/82 |
| 2011/0291549 A1 | 12/2011 | Kim et al. |

FOREIGN PATENT DOCUMENTS

| CN | 1963609 | 5/2007 |
| JP | 2008135333 | 6/2008 |
| JP | 2011239460 | 11/2011 |
| TW | I361637 | 4/2012 |

* cited by examiner

*Primary Examiner* — Joseph Schoenholtz
(74) *Attorney, Agent, or Firm* — WPAT, PC; Justin King

(57) ABSTRACT

A pixel array includes a plurality of pixel groups, each of which includes a plurality of brightness sub-pixel regions, a plurality of first sub-pixel regions, and a plurality of second sub-pixel regions. Each brightness sub-pixel regions has a first side, a second side, a third side, and a fourth side. The first sub-pixel regions include a first group and a second group, and the second sub-pixel regions include a third group and a fourth group. The first, the second, the third, and the fourth groups are respectively disposed at the first, the third, the second, and the fourth sides of the first brightness sub-pixel region. Extension lines of long directions of the first, the second, the third, and the fourth groups respectively interlace a vertical baseline at a first angle θ1, a second angle θ2, a third angle θ3, and a fourth angle θ4. 0°<θ1<90°, 0°<θ2<90°, 0°<θ3<90°, and 0°<θ4<90°.

20 Claims, 13 Drawing Sheets

DISPLAY PANEL AND PIXEL ARRAY THEREOF

RELATED APPLICATIONS

This application claims priority to Chinese Application Serial Number 201410171459.8, filed Apr. 25, 2014, and Chinese Application Serial Number 201410358992.5, filed Jul. 25, 2014, which is herein incorporated by reference.

BACKGROUND

1. Field of Disclosure

The present invention relates to a pixel array, especially relates to a pixel array of a display panel.

2. Description of Related Art

Recently, portable display panels have gradually replaced regular displays. Compared to other display panels, auto-luminescence displays such as organic or inorganic light-emitting displays have more superiorities of wide viewing angles, good contrast, and high response speeds. Therefore, the organic or inorganic light emitting displays, especially organic light emitting diode (OLED) displays composed by organic materials, have been widely focused as the next generation displays. Compared to the inorganic light emitting displays, the OLED displays have good brightness, lower driving voltages, and faster response times while providing color images.

The organic light emitting diodes can be grouped to be passive matrix OLEDs (PMOLEDs) and active matrix OLEDs (AMOLEDs) according to their driving methods. The light emitting diode of a PMOLED is not luminous until the data is written therein. The PMOLED with this driving method has simple structure, low cost, and is easy to design. Therefore, the PMOLED is suitable for small/medium-sized displays. On the other hand, for the AMOLED, each pixel of the pixel array thereof has a capacitor to store data, maintaining each pixel luminous. Since the power consumption of the AMOLED is lower than that of PMOLED, and the driving method of the AMOLED is suitable for large-sized and high-resolution displays, the AMOLED has became main trend of display development.

In general, pixels per inch (ppi) is a unit of pixel resolution of displays, which represents the number of pixels contained in each square inch. The higher the ppi value, the higher the pixel density, resulting in more abundant details of the images. In related art, the pixel arrangement of the conventional AMOLED is that blue sub-pixels, green sub-pixels, and red sub-pixels are disposed side by side, and the pixel arrangement of the AMOLED is a strip arrangement. A tolerance space is formed between any two immediately adjacent sub-pixels, such that the conventional AMOLED is hard to achieve high aperture ratio or high resolution. Moreover, the same color sub-pixels in some arrangements of the AMOLED are adjacent disposed, which lowers the display quality if the adjacent sub-pixels are high brightness green sub-pixels.

In view of above, many in the industry are striving to provide a new display panel or improve the conventional display panel (especially its pixel array) to increase the aperture ratio and upgrade the display quality, thereby improving or eliminating the drawbacks mentioned above.

SUMMARY

An aspect of the present disclosure is to provide a display panel having a pixel array. The pixel array of the display panel includes a plurality of 2×6 sub-pixel matrixes. Each of the sub-pixel matrixes includes four brightness sub-pixels, four first sub-pixels $P_{11}$~$P_{14}$, and four second sub-pixels $P_{21}$~$P_{24}$. In the sub-pixel matrixes: a first column sequentially includes the first sub-pixel $P_{11}$ and the second sub-pixel $P_{21}$; a second column sequentially includes the first brightness sub-pixel and the second brightness sub-pixel; a third column sequentially includes the second sub-pixel $P_{22}$ and the first sub-pixel $P_{12}$; a fourth column sequentially includes the first sub-pixel $P_{13}$ and the second sub-pixel $P_{23}$; a fifth column sequentially includes the third brightness sub-pixel and the fourth brightness sub-pixel; and a sixth column sequentially includes the second sub-pixel $P_{24}$ and the first sub-pixel $P_{14}$. All of the first sub-pixels and the second sub-pixels are disposed around the brightness sub-pixels, and the first sub-pixels and the second sub-pixels are respectively disposed at two adjacent sides of the brightness sub-pixels.

In one or more embodiments, each the brightness sub-pixels is a green sub-pixel.

In one or more embodiments, the brightness sub-pixels include yellow sub-pixels and green sub-pixels. The brightness sub-pixels with the same color are disposed at different rows and the same column, or at different rows and different columns.

In one or more embodiments, the first brightness sub-pixels and the fourth brightness sub-pixels are the yellow sub-pixels, and the second brightness sub-pixels and the third brightness sub-pixels are the green sub-pixels.

In one or more embodiments, the first brightness sub-pixels and the third brightness sub-pixels are the yellow sub-pixels, and the second brightness sub-pixels and the fourth brightness sub-pixels are the green sub-pixels.

In one or more embodiments, the first sub-pixels are blue sub-pixels, and the second sub-pixels are red sub-pixels.

In one or more embodiments, the first sub-pixels are red sub-pixels, and the second sub-pixels are blue sub-pixels.

In one or more embodiments, an arrangement direction of the first sub-pixel $P_{11}$ is substantially orthogonal to an arrangement direction of the first sub-pixel $P_{12}$, an arrangement direction of the first sub-pixel $P_{13}$ is substantially orthogonal to an arrangement direction of the first sub-pixel $P_{14}$, and the arrangement direction of the first sub-pixel $P_{11}$ is substantially parallel to the arrangement direction of the first sub-pixel $P_{14}$.

In one or more embodiments, an arrangement direction of the second sub-pixel $P_{21}$ is substantially orthogonal to an arrangement direction of the second sub-pixel $P_{22}$, an arrangement direction of the second sub-pixel $P_{23}$ is substantially orthogonal to an arrangement direction of the second sub-pixel $P_{24}$, and the arrangement direction of the second sub-pixel $P_{21}$ is substantially parallel to the arrangement direction of the second sub-pixel $P_{24}$.

In one or more embodiments, the display panel is an organic light emitting diode display.

Another aspect of the present disclosure is to provide a plurality of pixel groups. Each of the pixel groups at least includes a plurality of brightness sub-pixel regions, a plurality of first sub-pixel regions, and a plurality of second sub-pixel regions. The brightness sub-pixel regions at least includes five of the brightness sub-pixel regions. Each of the brightness sub-pixel regions has a first side, a second side, a third side, and a fourth side. The first sub-pixel regions at least include a first group and a second group. Each of the first sub-pixel regions at least has a long direction and a short direction. The first group is disposed at the first side of the first brightness sub-pixel region, and the second group is disposed at the third side of the first brightness sub-pixel region. An extension line of the long direction of the first group interlaces a vertical baseline at a first angle θ1, and an extension line of the long direction of the second group interlaces the vertical baseline at a second angle θ2. The vertical baseline is perpendicular to a horizontal baseline. The second sub-pixel regions at least include a third group and a fourth group. Each of the second sub-pixel regions at least has a long direction and a short direction. The third group is disposed at the second side of the first brightness sub-pixel region, and the fourth group is disposed at the fourth side of the first brightness sub-pixel region. An extension line of the long direction of the third group interlaces the vertical baseline at a third angle θ3, and an extension line of the long direction of the fourth group interlaces the vertical baseline at a fourth angle θ4, wherein 0°<θ1<90°, 0°<θ2<90°, 0°<θ3<90°, and 0°<θ4<90°.

In one or more embodiments, a first accommodating space is formed between the second group and the fourth group, a second accommodating space is formed between the first group and the fourth group, a third accommodating space is formed between the first group and the third group, and a fourth accommodating space is formed between the third group and the second group, wherein the second brightness sub-pixel region is disposed in the first accommodating space, the third brightness sub-pixel region is disposed in the second accommodating space, the fourth brightness sub-pixel region is disposed in the third accommodating space, and the fifth brightness sub-pixel region is disposed in the fourth accommodating space.

In one or more embodiments, a centroid connecting line between the second brightness sub-pixel region disposed in the first accommodating space and the third brightness sub-pixel region disposed in the second accommodating space interlaces the vertical baseline at a fifth angle θ5, and 0°<θ5<90°.

In one or more embodiments, a centroid connecting line between the fourth brightness sub-pixel region disposed in the third accommodating space and the fifth brightness sub-pixel region disposed in the fourth accommodating space interlaces the vertical baseline at a sixth angle θ6, and 0°<θ6<90°.

In one or more embodiments, an extension direction of a centroid connecting line among the first brightness sub-pixel region, the second brightness sub-pixel region disposed in the first accommodating space, and the fourth brightness sub-pixel region disposed in the third accommodating space is substantially parallel to the vertical baseline.

In one or more embodiments, an extension direction of a centroid connecting line among the first brightness sub-pixel region, the third brightness sub-pixel region disposed in the second accommodating space, and the fifth brightness sub-pixel region disposed in the fourth accommodating space is substantially parallel to the horizontal baseline.

In one or more embodiments, there is no other brightness sub-pixel region disposed between any two adjacent of the five brightness sub-pixel regions.

In one or more embodiments, the five brightness sub-pixel regions are all green.

In one or more embodiments, the first brightness sub-pixel region, the third brightness sub-pixel region disposed in the second accommodating space, and the fifth brightness sub-pixel region disposed in the fourth accommodating space are all green. The second brightness sub-pixel region disposed in the first accommodating space and the fourth brightness sub-pixel region disposed in the third accommodating space are both yellow or white.

In one or more embodiments, the first group and the second group at least respectively include one of the first sub-pixel regions, and the third group and the fourth group at least respectively include two immediately adjacent of the second sub-pixel regions.

In one or more embodiments, the first group and the second group at least respectively include two immediately adjacent of the first sub-pixel regions, the third group, and the fourth group at least respectively include two of the immediately adjacent second sub-pixel regions.

BRIEF DESCRIPTION OF THE DRAWINGS

FIGS. 2A-2D are schematic diagrams of the blue sub-pixel (region) of FIG. 1A according to a plurality of embodiments;

DETAILED DESCRIPTION

Figure 1A:
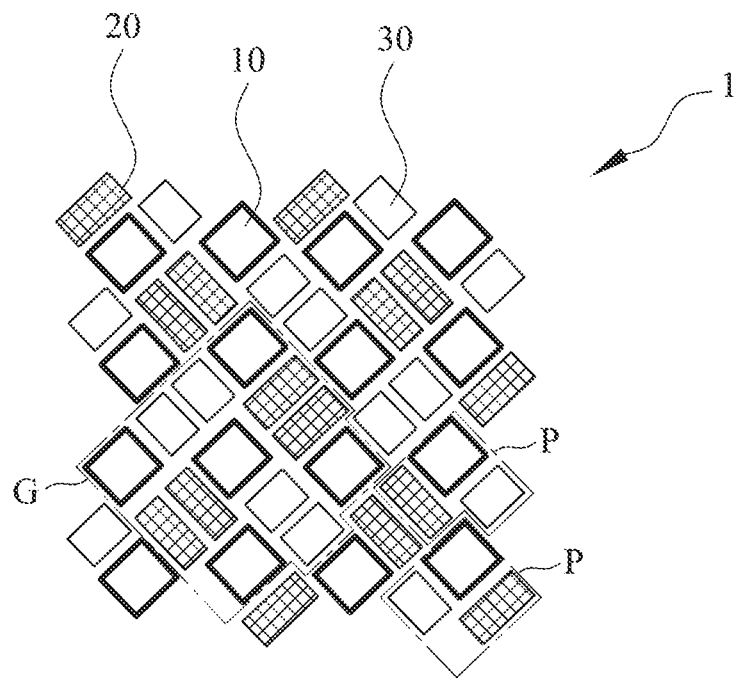
FIG. 1A is a schematic diagram of a pixel array of a display panel according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

Figure 1B:
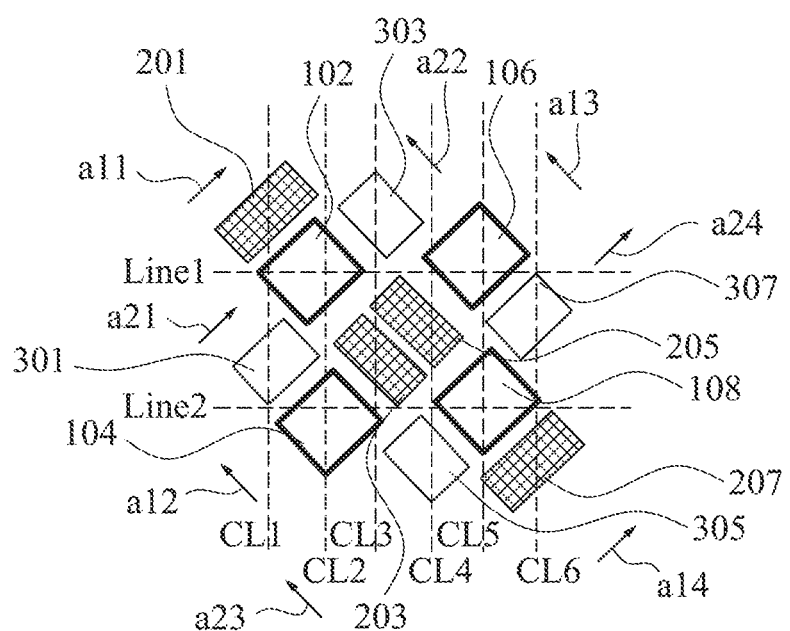
FIG. 1B is a schematic diagram of a single sub-pixel matrix of the pixel array of FIG. 1A.
Figure 1C:
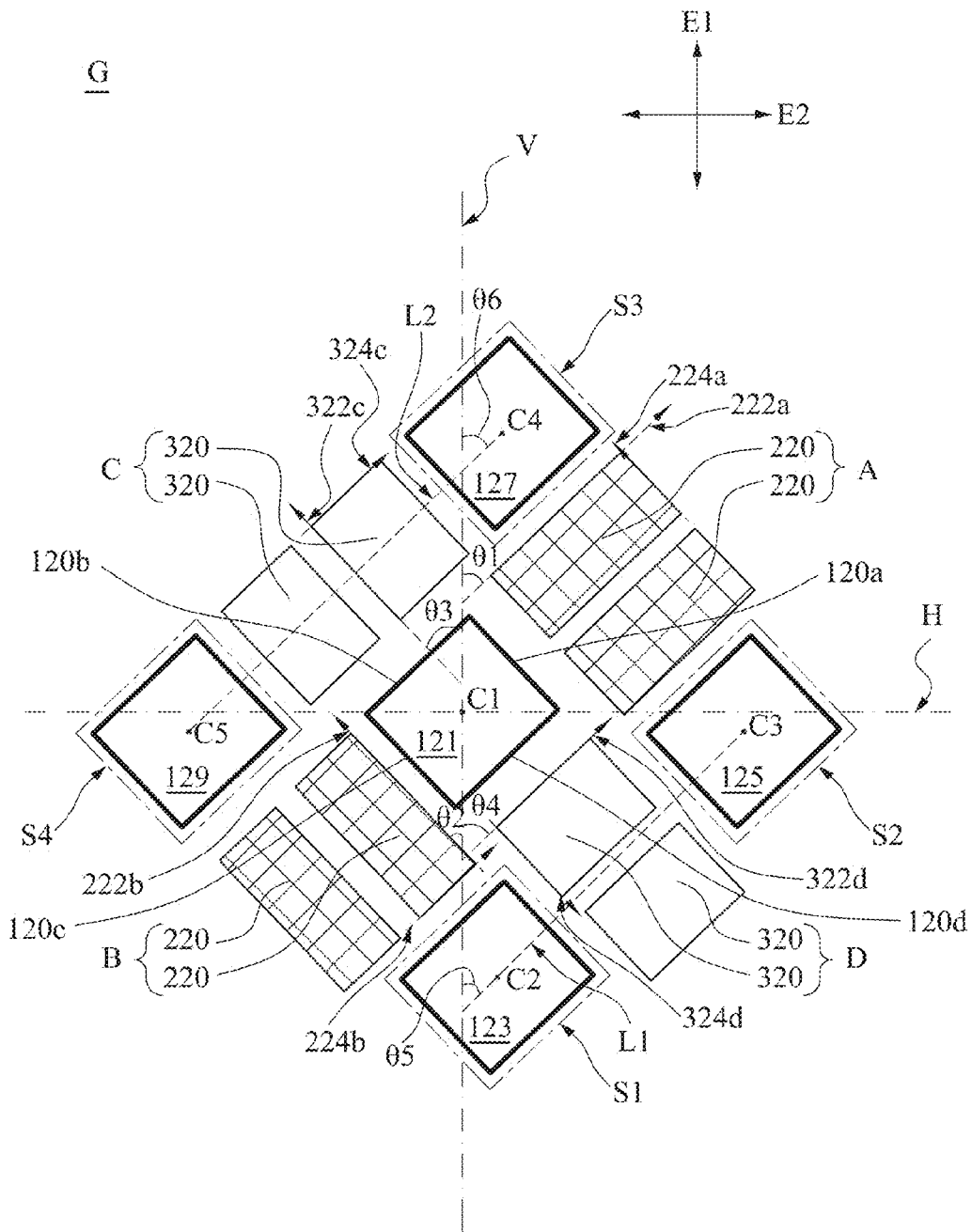
FIG. 1C is a schematic diagram of a single pixel group of the pixel array of FIG. 1A.

FIG. 1A is a schematic diagram of a pixel array 1 of a display panel according to one embodiment of the present disclosure, FIG. 1B is a schematic diagram of a single sub-pixel matrix of the pixel array 1 of FIG. 1A, and FIG. 1C is a schematic diagram of a single pixel group G of the pixel array 1 of FIG. 1A.

Reference is made to FIG. 1A. The display panel of this embodiment may be a display panel of an organic light emitting diode (OLED) display, having the pixel array 1. The pixel array 1 is composed by three different kinds of sub-pixels, that is, brightness sub-pixels (also called brightness sub-pixel regions) 10, blue sub-pixels (also called blue sub-pixel regions) 20, and red sub-pixels (also called red sub-pixel regions) 30. The brightness sub-pixel(s) (regions) 10 are distributed in the pixel array 1. All of the blue sub-pixel(s) (regions) 20 and the red sub-pixel(s) (regions) 30 are disposed around the brightness sub-pixel(s) (regions) 10, and the blue sub-pixel(s) (regions) 20 and the red sub-pixel(s) (regions) 30 are respectively disposed at two adjacent sides of the corresponding brightness sub-pixel(s) (regions) 10.

In this embodiment, each the brightness sub-pixel(s) (regions) 10 is a green sub-pixel (region), the blue sub-pixel(s) (regions) 20 can be named as first sub-pixel(s) (regions), and the red sub-pixel(s) (regions) 30 can be named as second sub-pixel(s) (regions). The brightness of the single brightness sub-pixel (region) 10 is substantially higher than that of the single first sub-pixel (region) and the single second sub-pixel (region). That is, under a predetermined driving current or voltage, for example, the same driving current or voltage, the brightness of the brightness sub-pixel(s) (regions) 10 is substantially higher than that of other sub-pixel(s) (regions), such as the red sub-pixel(s) (regions) 30 and the blue sub-pixel(s) (regions) 20. Therefore, in this embodiment, the brightness of the single green sub-pixel (region) is substantially greater than that of the blue sub-pixel (region) 20 and that of the red sub-pixel (region) 30.

In greater detail, as shown in FIGS. 1A and 1B, the pixel array 1 of the display panel includes a plurality of the 2×6 sub-pixel matrixes, i.e., rows Line 1 and Line 2, columns CL1~CL6. Each of the sub-pixel matrixes includes four brightness sub-pixel(s) (regions), four blue sub-pixel(s) (regions), and four red sub-pixel(s) (regions). In the sub-pixel matrix of FIG. 1B, the first column CL1 sequentially includes the blue sub-pixel (region) 201 and the red sub-pixel (region) 301; the second column CL2 sequentially includes the green sub-pixel(s) (regions) 102 and 104; the third column CL3 sequentially includes the red sub-pixel (region) 303 and the blue sub-pixel (region) 203; the fourth column CL4 sequentially includes the blue sub-pixel (region) 205 and the red sub-pixel (region) 305; the fifth column CL5 sequentially includes the green sub-pixel(s) (regions) 106 and 108; and the sixth column CL6 sequentially includes the red sub-pixel (region) 307 and the blue sub-pixel (region) 207.

From another viewpoint, the pixel array 1 of FIG. 1A includes a plurality of the pixel groups G. As shown in FIG. 1C, each of the pixel groups G at least includes five brightness sub-pixel(s) (regions) 121 (also called a first brightness sub-pixel (region)), 123 (also called a second brightness sub-pixel (region)), 125 (also called a third brightness sub-pixel (region)), 127 (also called a fourth brightness sub-pixel (region)), 129 (also called a fifth brightness sub-pixel (region)), blue sub-pixel(s) (regions) 220 of a first group A, blue sub-pixel(s) (regions) 220 of a second group B, red sub-pixel(s) (regions) 320 of a third group C, and red sub-pixel(s) (regions) 320 of a fourth group D. Each of the brightness sub-pixel(s) (regions) 121, 123, 125, 127, and 129 has a first side 120a, a second side 120b, a third side 120c, and a fourth side 120d. Each of the blue sub-pixel(s) (regions) 220 at least has a long direction 222a (222b) and a short direction 224a (224b). The blue sub-pixel(s) (regions) 220 of the first group A are disposed at the first side 120a of the first brightness sub-pixel (region) 121, and the blue sub-pixel(s) (regions) 220 of the second group B are disposed at the third side 120c of the first brightness sub-pixel region 121. An extension line of the long direction 222a of the blue sub-pixel(s) (regions) 220 of the first group A interlaces a vertical baseline V at a first angle θ1, and an extension line of the long direction 222b of the blue sub-pixel(s) (regions) 220 of the second group B interlaces the vertical baseline V at a second angle θ2. The vertical baseline V is perpendicular to a horizontal baseline H. Each of the red sub-pixel(s) (regions) 320 at least has a long direction 322c (322d) and a short direction 324c (324d). The red sub-pixel(s) (regions) 320 of the third group C are disposed at the second side 120b of the first brightness sub-pixel (region) 121, and the red sub-pixel(s) (regions) 320 of the fourth group D are disposed at the fourth side 120d of the first brightness sub-pixel (region) 121. An extension line of the long direction 322c of the red sub-pixel(s) (regions) 320 of the third group C interlaces the vertical baseline V at a third angle θ3, and an extension line of the long direction 322d of the red sub-pixel(s) (regions) 320 of the fourth group D interlaces the vertical baseline V at a fourth angle θ4, wherein 0°<θ1<90°, 0°<θ2<90°, 0°<θ3<90°, and 0°<θ4<90°. For example, preferred, all of the first angle θ1, the second angle θ2, the third angle θ3, and the fourth angle θ4 are about 45 degrees.

In this embodiment, the display panel can include a plurality of data lines and scan lines (not shown in the figures for clarity) interlacing to each other. These data lines and scan lines are respectively connected to the pixel array 1 (see FIG. 1A). The vertical baseline V may be substantially parallel to the extension line of the data lines, and the horizontal baseline H may be substantially parallel to the extension line of the scan lines, or vice versa. In other words, under this situation, all of the long directions 222a, 222b, 322c, and 322d are not parallel to the extension lines of the data lines and/or the scan lines.

Figure 6A:
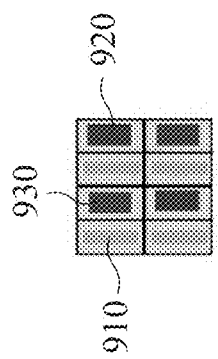
FIG. 6A is a structural schematic diagram of a pixel array according to another comparison example.

Reference is made to FIG. 1A. Briefly, the pixel array 1 of this embodiment can meet both high aperture ratio and high resolution. More specifically, the resolution of the display panel is limited by the manufacturing tolerance. That is, the higher the manufacturing tolerance, the lower the resolution of the display panel. For example, under the recent manufacturing capability of the organic light emitting diode display panel, the manufacturing tolerance is about ±15 μm. For a pixel array arranged in a traditional manner (as shown in FIG. 6A), to reach 326-ppi (pixel per inch) high resolution, the width of a single pixel unit is about 78 μm. That is, the width of each sub-pixel (region) is only about 26 μm, which is much smaller than the manufacturing tolerance. Therefore, the aperture ratio not only may be not increase, or even is greatly decreased. The traditional pixel arrangement (stripe arrangement) is that the red sub-pixel(s) (regions) are arranged in the same column (also called a first column), the green sub-pixel(s) (regions) are arranged in the same column (also called a second column), and the blue sub-pixel(s) (regions) are arranged in the same column (also called a third column). Furthermore, for the same row, the red sub-pixel (region), the green sub-pixel (region), and the blue sub-pixel (region) are sequence arranged. However, in this embodiment, with the arrangement mentioned in FIGS. 1A to 1C, the spaces between the brightness sub-pixel(s) (regions) 10 and the surrounded blue sub-pixel(s) (regions) 20, and the spaces between the brightness sub-pixel(s) (regions) 10 and the surrounded red sub-pixel(s) (regions) 30 can be about or over 30 µm, which is greater than the manufacturing tolerance. Therefore, to compare with the traditional pixel array, the pixel array 1 of this embodiment has higher aperture ratio while it has high resolution. In one example, for the pixel array 1 with 326-ppi resolution, the aperture ratio of the brightness sub-pixel(s) (regions) 10 was about 14.2%, the aperture ratio of the blue sub-pixel(s) (regions) 20 was about 20.1%, the aperture ratio of the red sub-pixel(s) (regions) 30 was about 17.4%, and the average aperture ratio was about 17.2%.

Furthermore, in this embodiment, the brightness sub-pixel(s) (regions) 10 are arranged in an array manner, and the blue sub-pixel(s) (regions) 20 and the red sub-pixel(s) (regions) are distributed around the brightness sub-pixel(s) (regions) 10. That is, the distance between two of the brightness sub-pixel(s) (regions) is not so far, avoiding uneven color performance and improving the display quality of the display panel.

Reference is made to FIG. 1B. In this embodiment, the arrangement direction a11 of the blue sub-pixel (region) 201 is substantially orthogonal to (or namely substantially perpendicular to) the arrangement direction a12 of the blue sub-pixel (region) 203, and the arrangement direction a12 of the blue sub-pixel (region) 203 is substantially orthogonal to (or namely substantially perpendicular to) the arrangement direction a14 of the blue sub-pixel (region) 207. That is, the extension line of the long direction of the blue sub-pixel (region) 201 is orthogonal to the extension line of the long direction of the blue sub-pixel (region) 203, and the extension line of the long direction of the blue sub-pixel (region) 203 is substantially orthogonal to (or namely substantially perpendicular to) the extension line of the long direction of the blue sub-pixel (region) 207. The arrangement direction a13 of the blue sub-pixel (region) 205 is substantially orthogonal to (or namely substantially perpendicular to) the arrangement direction a14 of the blue sub-pixel (region) 207, and the arrangement direction a13 of the blue sub-pixel (region) 205 is substantially orthogonal to (or namely substantially perpendicular to) the arrangement direction a11 of the blue sub-pixel (region) 201. That is, the extension line of the long direction of the blue sub-pixel (region) 205 is substantially orthogonal to (or namely substantially perpendicular to) the extension line of the long direction of the blue sub-pixel (region) 207, and the extension line of the long direction of the blue sub-pixel (region) 205 is substantially orthogonal to (or namely substantially perpendicular to) the extension line of the long direction of the blue sub-pixel (region) 201. Furthermore, the arrangement direction a11 of the blue sub-pixel (region) 201 is substantially parallel to the arrangement direction a14 of the blue sub-pixel (region) 207, and the arrangement direction a12 of the blue sub-pixel (region) 203 is substantially parallel to the arrangement direction a13 of the blue sub-pixel (region) 205. That is, the extension line of the long direction of the blue sub-pixel (region) 201 is substantially parallel to the extension line of the long direction of the blue sub-pixel (region) 207, and the extension line of the long direction of the blue sub-pixel (region) 203 is substantially parallel to the extension line of the long direction of the blue sub-pixel (region) 205. Moreover, the two immediately adjacent (or namely two adjoin) blue sub-pixel(s) (regions) 203 and 205 can increase the aperture ratio of the display panel.

Similarly, the arrangement direction a21 of the red sub-pixel (region) 301 is substantially orthogonal to (or namely substantially perpendicular to) the arrangement direction a22 of the red sub-pixel (region) 303, and the arrangement direction a22 of the red sub-pixel (region) 303 is substantially orthogonal to (or namely substantially perpendicular to) the arrangement direction a24 of the red sub-pixel (region) 307. That is, the extension line of the long direction of the red sub-pixel (region) 301 is substantially orthogonal to (or namely substantially perpendicular to) the extension line of the long direction of the red sub-pixel (region) 303, and the extension line of the long direction of the red sub-pixel (region) 303 is substantially orthogonal to (or namely substantially perpendicular to) the extension line of the long direction of the red sub-pixel (region) 307. The arrangement direction a23 of the red sub-pixel (region) 305 is substantially orthogonal to (or namely substantially perpendicular to) the arrangement direction a24 of the red sub-pixel (region) 307, and the arrangement direction a23 of the red sub-pixel (region) 305 is substantially orthogonal to (or namely substantially perpendicular to) the arrangement direction a21 of the red sub-pixel (region) 301. That is, the extension line of the long direction of the red sub-pixel (region) 305 is substantially orthogonal to (or namely substantially perpendicular to) the extension line of the long direction of the red sub-pixel (region) 307, and the extension line of the long direction of the red sub-pixel (region) 305 is substantially orthogonal to (or namely substantially perpendicular to) the extension line of the long direction of the red sub-pixel (region) 301. Furthermore, the arrangement direction a21 of the red sub-pixel (region) 301 is substantially parallel to the arrangement direction a24 of the red sub-pixel (region) 307, and the arrangement direction a22 of the red sub-pixel (region) 303 is substantially parallel to the arrangement direction a23 of the red sub-pixel (region) 305. That is, the extension line of the long direction of the red sub-pixel (region) 301 is substantially parallel to the extension line of the long direction of the red sub-pixel (region) 307, and the extension line of the long direction of the red sub-pixel (region) 303 is substantially parallel to the extension line of the long direction of the red sub-pixel (region) 305.

Figures 2A, 2B, 2C, 2D:
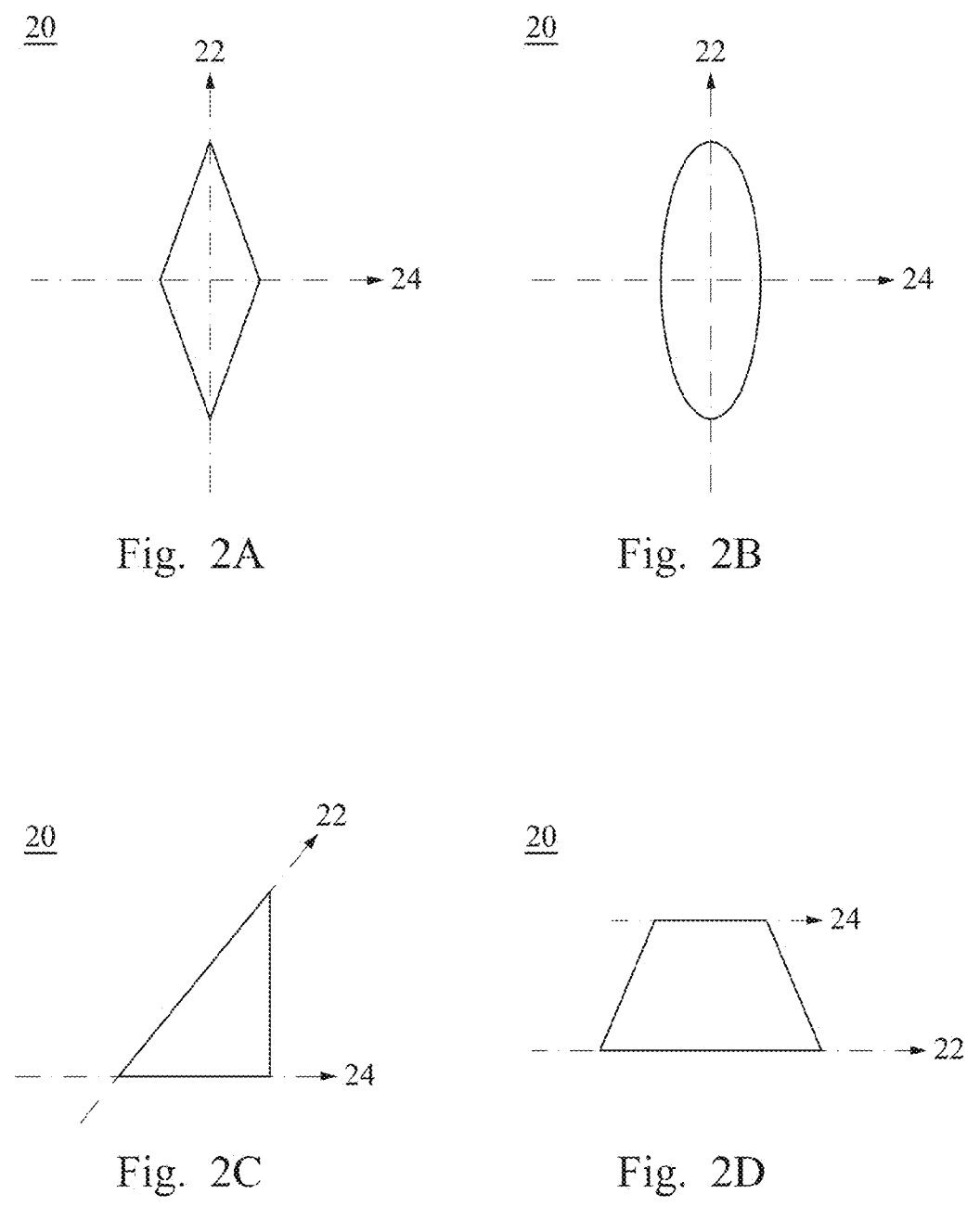

Reference is made to FIG. 1C. In this embodiment, both of the blue sub-pixel(s) (regions) 220 and the red sub-pixel(s) (regions) 320 are rectangular as an example. Therefore, the long directions 222a, 222b, 322c, and 322d are the extension directions of long sides of the rectangles while the short directions 224a, 224b, 324c, and 324d are the extension directions of short sides of the rectangles. However, the shapes of the blue sub-pixel(s) (regions) 220 and the red sub-pixel(s) (regions) 320 are not limited in the example of FIG. 1C. FIGS. 2A-2D are schematic diagrams of the blue sub-pixel (region) 20 of FIG. 1A according to a plurality of embodiments. Since at least one of the blue sub-pixel(s) (regions) 20 and the red sub-pixel(s) (regions) 30 can be the following shapes, the blue sub-pixel (region) 20 is described herein while the red sub-pixel(s) (regions) 30 are not repeated hereinafter. In FIG. 2A, the blue sub-pixel (region) 20 can be diamond-shaped. The long direction 22 is the extension direction of the long axis of the diamond while the short direction 24 is the extension direction of the short axis of the diamond. In FIG. 2B, the blue sub-pixel (region) 20 can be ellipse-shaped. The long direction 22 is the extension direction of the long axis of the ellipse while the short direction 24 is the extension direction of the short axis of the ellipse. In FIG. 2C, the blue sub-pixel (region) 20 can be a right triangle. The long direction 22 is the extension direction of the oblique side of the right triangle while the short direction 24 is the extension direction of the short side of the right triangle. In FIG. 2D, the blue sub-pixel (region) 20 can be trapezium-shaped. The long direction 22 is the extension direction of the bottom side of the trapezium while the short direction 24 is the extension direction of the top side of the trapezium. Moreover, although in FIG. 1C, both of the blue sub-pixel(s) (regions) 220 and the red sub-pixel(s) (regions) 320 are rectangular, in other embodiments, the shapes of the blue sub-pixel(s) (regions) 220 and the red sub-pixel(s) (regions) 320 can be different, and the claimed scope is not limited in this respect.

Reference is made to FIG. 1C. In this embodiment, the first side 120a of the brightness sub-pixel (region) 121 is immediately adjacent to (or namely adjoin to, or neighbor with) the short side (i.e., the short direction) of the blue sub-pixel(s) (regions) 220 of the first group A, the second side 120b is immediately adjacent to (or namely adjoin to, or neighbor with) the short side (i.e., the short direction) of the red sub-pixel(s) (regions) 320 of the third group C, the third side 120c is immediately adjacent to (or namely adjoin to, or neighbor with) the long side (i.e., the long direction) of the blue sub-pixel(s) (regions) 220 of the second group B, and fourth side 120d is immediately adjacent to (or namely adjoin to, or neighbor with) the long side (i.e., the long direction) of the red sub-pixel(s) (regions) 320 of the fourth group D.

In this embodiment, the first group A and the second group B at least respectively include two immediately adjacent (or namely adjoin, or neighbor) of the blue sub-pixel(s) (regions) 220, and the third group C and the fourth group D at least respectively include two immediately adjacent (or namely adjoin, or neighbor) of the red sub-pixel(s) (regions) 320. Reference is made again to FIG. 1A. For each of the brightness sub-pixel(s) (regions) 10, it can combine with one immediately adjacent (or namely adjoin, or neighbor) of the blue sub-pixel(s) (regions) 20 and one immediately adjacent (or namely adjoin, or neighbor) of the red sub-pixel(s) (regions) 30 to form a pixel unit P. At least two sides of the brightness sub-pixel (region) 10 of each of the pixel unit P is adjacent to the long sides of the blue sub-pixel (region) 20 and the red sub-pixel (region) 30, such that the arrangement of the pixel unit P is tight, resulting in good display quality.

Figure 3:
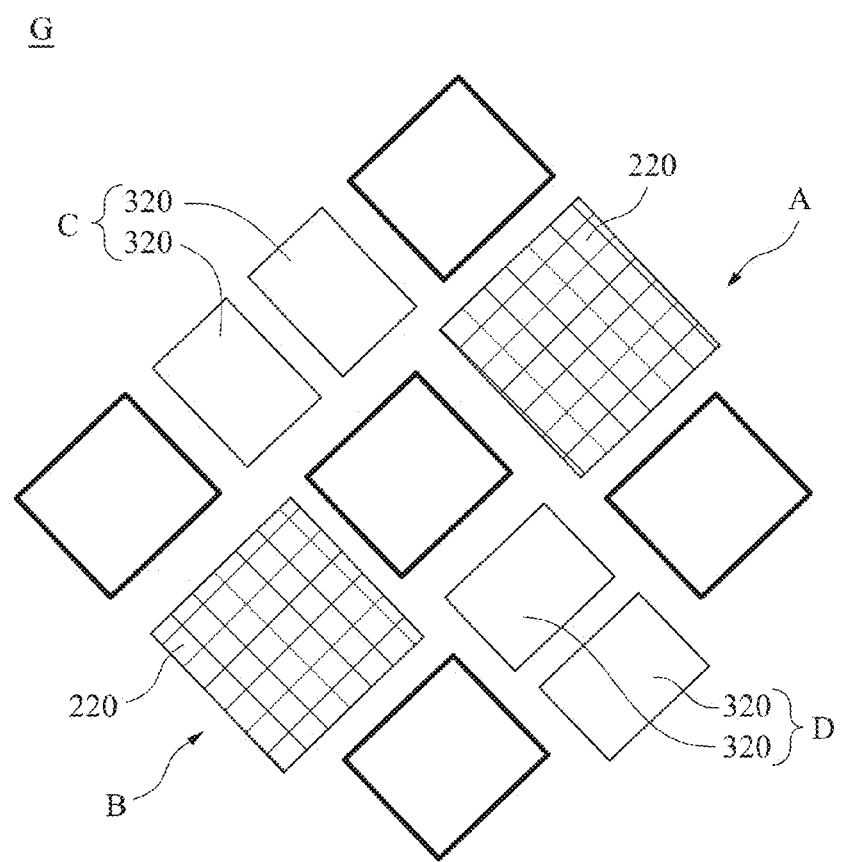
FIG. 3 is a pixel group according to another embodiment of the present disclosure.

However, the arrangement is not limited with the respect mentioned above. FIG. 3 is a pixel group G according to another embodiment of the present disclosure. In FIG. 3, the first group A and the second group B at least respectively include one blue sub-pixel (region) 220, and the third group C and the fourth group D at least respectively include two immediately adjacent (or namely adjoin, or neighbor) of the red sub-pixel(s) (regions) 320. That is, the area of the single blue sub-pixel (region) 220 in FIG. 3 is larger than that of the two immediately adjacent (or namely adjoin, or neighbor) blue sub-pixel(s) (regions) 220 of FIG. 1C, i.e., the gap (not marked) between the two immediately adjacent (or namely adjoin, or neighbor) blue sub-pixel(s) (regions) 220 of FIG. 1C has a pixel connecting region (not marked) to form the single blue sub-pixel(s) (regions) 220 of FIG. 3. Therefore, the number of the blue sub-pixel(s) (regions) 220 is less than the number of the red sub-pixel(s) (regions) 320 in FIG. 3. Such configuration can increase the aperture ratio of the blue sub-pixel(s) (regions) 220, facilitating a good display quality.

Reference is made again to FIG. 1C. In this embodiment, a first accommodating space S1 is formed between the second group B and the fourth group D, a second accommodating space S2 is formed between the first group A and the fourth group D, a third accommodating space S3 is formed between the first group A and the third group C, and a fourth accommodating space S4 is formed between the third group C and the second group B, such that the second brightness sub-pixel (region) 123 is disposed in the first accommodating space S1, the third brightness sub-pixel (region) 125 is disposed in the second accommodating space S2, the fourth brightness sub-pixel (region) 127 is disposed in the third accommodating space S3, and the fifth brightness sub-pixel (region) 129 is disposed in the fourth accommodating space S4. Taking FIG. 1C as an example, the first accommodating space S1, the second accommodating space S2, the third accommodating space S3, and the fourth accommodating space S4 are respectively disposed at the bottom side, the right side, the top side, and the left side of the first brightness sub-pixel (region) 121, such that the extension directions of centroid connecting lines (or namely center of form connecting lines) of the brightness sub-pixel(s) (regions) 121, 123, 125, 127, and 129 together form a shape substantially similar to a crisscross shape or a like crisscross shape. The centroid can be regarded as a center of a shape (form) viewed from top or bottom, i.e., a center of a shape (form) in which an element is vertically projected at a plane.

In greater detail, an extension direction E1 of a connecting line among the centroids C1, C2, and C4 of the first brightness sub-pixel (region) 121, the second brightness sub-pixel (region) 123 in the first accommodating space S1, and the fourth brightness sub-pixel (region) 127 in the third accommodating space S3 is substantially parallel to the vertical baseline V. More specifically, in FIG. 1C, although the connecting line of the centroids C4, C1, and C2 are approximately a zigzag line, the extension direction E1 thereof is substantially parallel to the vertical baseline V. That is, if the vertical baseline V passes through the centroid C1, the vertical baseline V also respectively passes through a portion of the second brightness sub-pixel (region) 123 and the fourth brightness sub-pixel (region) 127 although it is not necessary to pass through the centroids C2 and C4. However, in other embodiments, the vertical baseline V can pass through all of the centroids C1, C2, and C4.

Moreover, an extension direction E2 of a connecting line among the centroids C1, C3, and C5 of the first brightness sub-pixel (region) 121, the third brightness sub-pixel (region) 125 in the second accommodating space S2, and the fifth brightness sub-pixel (region) 129 in the fourth accommodating space S4 is substantially parallel to the horizontal baseline H. More specifically, in FIG. 1C, although the connecting line of the centroids C5, C1, and C3 are approximately a zigzag line, the extension direction E2 thereof is substantially parallel to the horizontal baseline H. That is, if the horizontal baseline H passes through the centroid C1, the horizontal baseline H also respectively passes through a portion of the third brightness sub-pixel (region) 125 and the fifth brightness sub-pixel (region) 129 although it is not necessary to pass through the centroids C3 and C5. However, in other embodiments, the horizontal baseline H can pass through all of the centroids C1, C3, and C5.

In summary, reference is made back to FIG. 1A. The brightness sub-pixel(s) (regions) 10 in this embodiment are all diamond-shaped, and are substantially arranged along the vertical baseline V and the horizontal baseline H (see FIG. 1C) to form a two-dimensional array. In other embodiments, the shape of the brightness sub-pixel(s) (regions) 10 can be other suitable shapes, such as a square, a pentagon, a circle, a trapezoid, etc.

Reference is made to FIG. 1C. In this embodiment, a connecting line L1 between the centroids C2 and C3 of the second brightness sub-pixel (region) 123 disposed in the first accommodating space S1 and the third brightness sub-pixel (region) 125 disposed in the second accommodating space S2 interlaces the vertical baseline V at a fifth angle $\theta 5$, and $0°<\theta 5<90°$. That is, the second brightness sub-pixel (region) 123 and the third brightness sub-pixel (region) 125 are obliquely arranged relative to the vertical baseline V. In this embodiment, the fifth angle θ5 is about 45°, and the claimed scope of the present disclosure in not limited in this respect.

Moreover, a connecting line L2 between the centroids C4 and C5 of the fourth brightness sub-pixel (region) 127 disposed in the third accommodating space S3 and the fifth brightness sub-pixel (region) 129 disposed in the fourth accommodating space S4 interlaces the vertical baseline V at a sixth angle θ6, and 0°<θ6<90°. That is, the fourth brightness sub-pixel (region) 127 and the fifth brightness sub-pixel (region) 129 are obliquely arranged relative to the vertical baseline V. In this embodiment, the sixth angle θ6 is about 45°, and the claimed scope of the present disclosure in not limited in this respect.

In one or more embodiments, the values of the fifth angle θ5 and the sixth angle θ6 can be the same, i.e., the connecting line L1 is substantially parallel to the connecting line L2. However, in other embodiments, the values of the fifth angle θ5 and the sixth angle θ6 can be different, depending on the real requirements of the pixel arrangement.

In this embodiment, there is no other brightness sub-pixel (region) disposed between any two adjacent of the five brightness sub-pixel(s) (regions) 121, 123, 125, 127, and 129. In FIG. 1C, the red sub-pixel(s) (regions) 320 of the fourth group D are disposed between the brightness sub-pixel(s) (regions) 123 and 125, the blue sub-pixel(s) (regions) 220 of the first group A are disposed between the brightness sub-pixel(s) (regions) 125 and 127, the red sub-pixel(s) (regions) 320 of the third group C are disposed between the brightness sub-pixel(s) (regions) 127 and 129, the blue sub-pixel(s) (regions) 220 of the second group B are disposed between the brightness sub-pixel(s) (regions) 129 and 123, and there is no sub-pixel(s) (regions) disposed between the brightness sub-pixel (region) 121 and any one of the brightness sub-pixel(s) (regions) 123, 125, 127, and 129.

In this embodiment, all of the brightness sub-pixel(s) (regions) 121, 123, 125, 127, and 129 are green sub-pixel(s) (regions). That is, the pixel array (see FIG. 1A) provides images composed of RGB. Moreover, the brightness of the single green sub-pixel (region) is substantially higher than that of the blue sub-pixel (region) 220 and that of the red sub-pixel (region) 320.

Figure 4A:
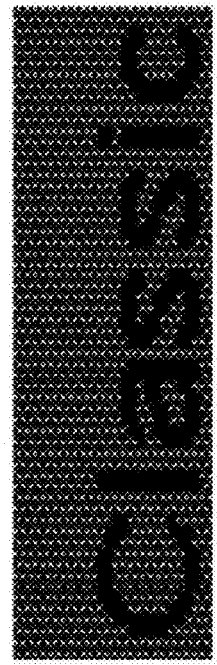
FIG. 4A is a photograph of 8 pt letters displayed using the pixel array according to one example of the present invention.
Figure 4B:
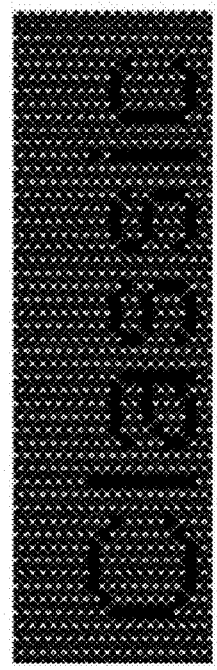
FIG. 4B is a photograph of 10 pt letters displayed using the pixel array according to one example of the present disclosure.

The following examples explains the display result of the pixel array 1 of FIG. 1A. FIG. 4A is a photograph of 8 pt letters displayed using the pixel array according to one example of the present invention, and FIG. 4B is a photograph of 10 pt letters displayed using the pixel array according to one example of the present invention. In these two examples, both of the resolutions of the pixel array were about 330 ppi. As shown in photographs, applying the pixel array 1 of FIG. 1A, either 8 pt and 10 pt letters could be presented clearly and high resolutions can be obtained.

Figure 5A:
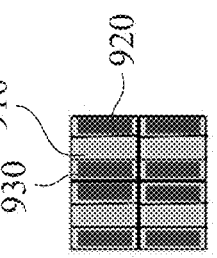
FIG. 5A is a structural schematic diagram of a pixel array according to one comparison example.
Figure 5B:
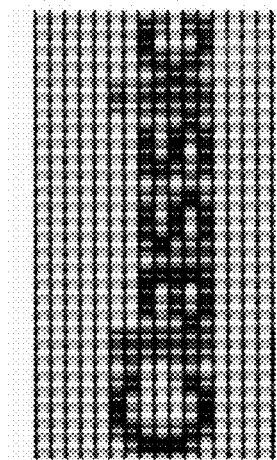
FIG. 5B is a photograph of letters displayed using the pixel array of FIG. 5A.

FIG. 5A is a structural schematic diagram of a pixel array according to one comparison example, and FIG. 5B is a photograph of letters displayed using the pixel array of FIG. 5A. In FIG. 5A, green sub-pixels 910 were disposed at odd columns, and blue sub-pixels 920 and red sub-pixels 930 were alternately arranged along even columns. All of the green sub-pixels 910, the blue sub-pixels 920, and the red sub-pixels 930 were rectangular. Although such an arrangement could simulate high resolution, additional algorisms must be included due to the high number difference among the green sub-pixels 910, the blue sub-pixels 920, and the red sub-pixels 930. Hence, the pixel array design was complicated. Furthermore, as shown in FIG. 5B, the display quality is bad, such as blurred edges of the letters.

Figure 6B:
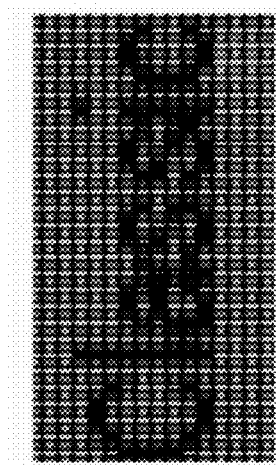
FIG. 6B is a photograph of letters displayed using the pixel array of FIG. 6A.

FIG. 6A is a structural schematic diagram of a pixel array according to another comparison example, and FIG. 6B is a photograph of letters displayed using the pixel array of FIG. 6A. In FIG. 6A, green sub-pixels 910, blue sub-pixels 920, and red sub-pixels 930 are alternately arranged. This arrangement is traditional, and this traditional (strip-shaped) arrangement was composed by the red sub-pixel(s) (regions) 930 arranging in the same column (the first column), the green sub-pixel(s) (regions) 910 arranging in the same column (the second column), and the blue sub-pixel(s) (regions) 920 arranging in the same column (the third column). The red sub-pixel(s) (regions) 930, the green sub-pixel(s) (regions) 910, and the blue sub-pixel(s) (regions) 920 were sequence arranged along the row direction. As mentioned above, since the pixel array of FIG. 6A was limited by manufacturing tolerance, the aperture ratio at high resolution condition not only may be not increase, or even is greatly decreased. Therefore, the requirements of high aperture ratio and high resolution can not be achieved simultaneously. Furthermore, as shown in FIG. 6B, the display quality was bad, such as blurred edges of the letters and the color was not black and is gray.

Figure 7A:
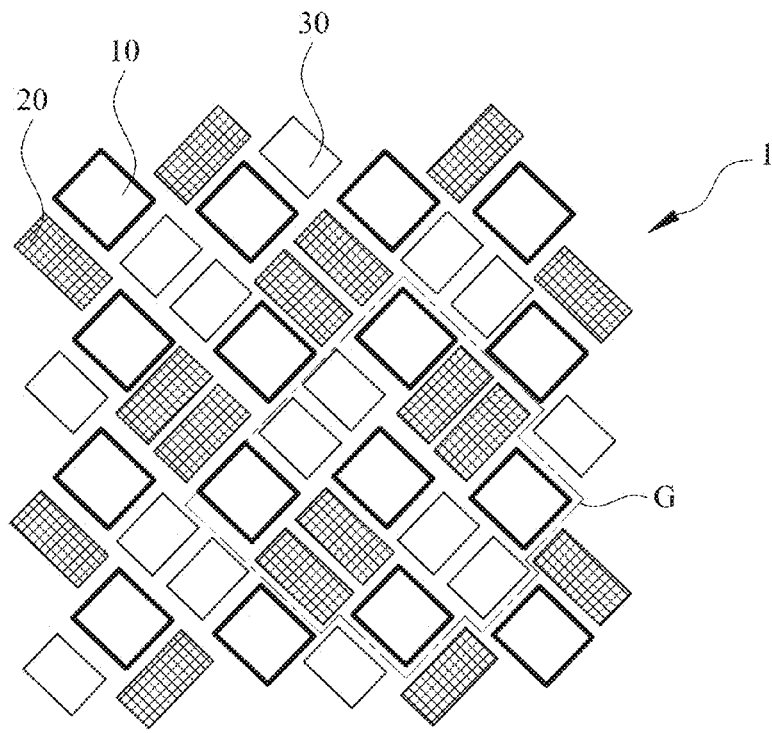
FIG. 7A is a schematic diagram of a pixel array of FIG. 1A according to an alternatively embodiment of the present disclosure.
Figure 7B:
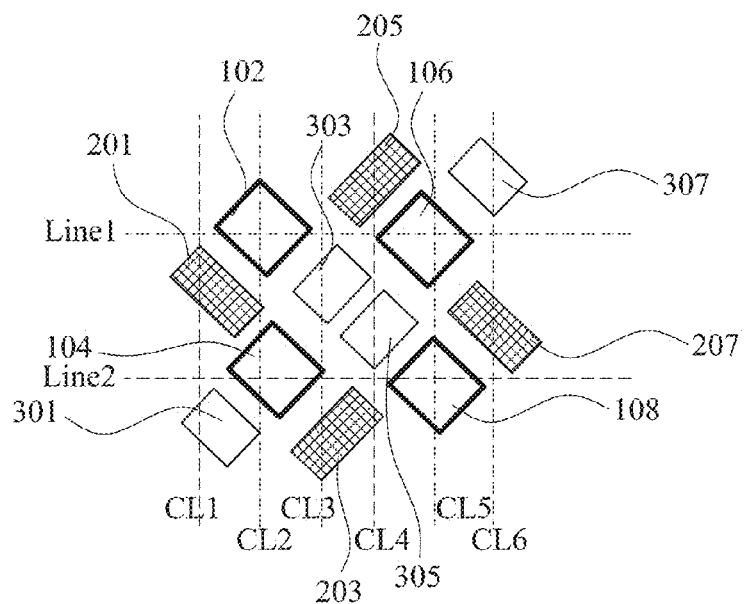
FIG. 7B is a schematic diagram of a single sub-pixel matrix of the pixel array of FIG. 7A.

FIG. 7A is a schematic diagram of a pixel array 1 of FIG. 1A according to an alternatively embodiment of the present disclosure, and FIG. 7B is a schematic diagram of a single sub-pixel matrix of the pixel array 1 of FIG. 7A. In this embodiment, similarly, each of the sub-pixel matrixes includes four brightness sub-pixel(s) (regions) 10, four blue sub-pixel(s) (regions) 20, and four red sub-pixel(s) (regions) 30. All of the blue sub-pixel(s) (regions) 20 and the red sub-pixel(s) (regions) 30 are disposed around the brightness sub-pixel(s) (regions) 10, and the blue sub-pixel(s) (regions) 20 and the red sub-pixel(s) (regions) 30 are respectively disposed at two adjacent sides of the corresponding brightness sub-pixel(s) (regions) 10.

The difference between the embodiment of FIGS. 7A and 7B and the embodiment of FIGS. 1A and 1B pertains to the positions of the blue sub-pixel(s) (regions) 20 and the red sub-pixel(s) (regions) 30. As shown in FIG. 7B, in the sub-pixel matrix, the arrangement direction of the blue sub-pixel (region) 201 is substantially orthogonal to (or namely substantially perpendicular to) the arrangement direction of the blue sub-pixel (region) 203, and the arrangement direction of the blue sub-pixel (region) 207 is substantially orthogonal to (or namely substantially perpendicular to) the arrangement direction of the blue sub-pixel (region) 203. That is, the extension line of the long direction of the blue sub-pixel (region) 201 is substantially orthogonal to (or namely substantially perpendicular to) the extension line of the long direction of the blue sub-pixel (region) 207, and the extension line of the long direction of the blue sub-pixel (region) 207 is substantially orthogonal to (or namely substantially perpendicular to) the extension line of the long direction of the blue sub-pixel (region) 203. The arrangement direction of the blue sub-pixel (region) 205 is substantially orthogonal to (or namely substantially perpendicular to) the arrangement direction of the blue sub-pixel (region) 207, and the arrangement direction of the blue sub-pixel (region) 205 is substantially orthogonal to (or namely substantially perpendicular to) the arrangement direction of the blue sub-pixel (region) 201. That is, the extension line of the long direction of the blue sub-pixel (region) 205 is substantially orthogonal to (or namely substantially perpendicular to) the extension line of the long direction of the blue sub-pixel (region) 207, and the extension line of the long direction of the blue sub-pixel (region) 205 is substantially orthogonal to (or namely substantially perpendicular to) the extension line of the long direction of the blue sub-pixel (region) 201. Furthermore, the arrangement direction of the blue sub-pixel (region) 201 is substantially parallel to the arrangement direction of the blue sub-pixel (region) 207, and the arrangement direction of the blue sub-pixel (region) 205 is substantially parallel to the arrangement direction of the blue sub-pixel (region) 203. That is, the extension line of the long direction of the blue sub-pixel (region) 201 is substantially parallel to the extension line of the long direction of the blue sub-pixel (region) 207, and the extension line of the long direction of the blue sub-pixel (region) 205 is substantially parallel to the extension line of the long direction of the blue sub-pixel (region) 203.

The arrangement direction of the red sub-pixel (region) 301 is substantially orthogonal to (or namely substantially perpendicular to) the arrangement direction of the red sub-pixel (region) 303, and the arrangement direction of the red sub-pixel (region) 303 is substantially orthogonal to (or namely substantially perpendicular to) the arrangement direction of the red sub-pixel (region) 307. That is, the extension line of the long direction of the red sub-pixel (region) 301 is orthogonal to the extension line of the long direction of the red sub-pixel (region) 303, and the extension line of the long direction of the red sub-pixel (region) 303 is substantially orthogonal to (or namely substantially perpendicular to) the extension line of the long direction of the red sub-pixel (region) 307. The arrangement direction of the red sub-pixel (region) 305 is substantially orthogonal to (or namely substantially perpendicular to) the arrangement direction of the red sub-pixel (region) 307, and the arrangement direction of the red sub-pixel (region) 305 is substantially orthogonal to (or namely substantially perpendicular to) the arrangement direction of the red sub-pixel (region) 301. That is, the extension line of the long direction of the red sub-pixel (region) 305 is substantially orthogonal to (or namely substantially perpendicular to) the extension line of the long direction of the red sub-pixel (region) 307, and the extension line of the long direction of the red sub-pixel (region) 305 is substantially orthogonal to (or namely substantially perpendicular to) the extension line of the long direction of the red sub-pixel (region) 301. Furthermore, the arrangement direction of the red sub-pixel (region) 301 is substantially parallel to the arrangement direction of the red sub-pixel (region) 307, and the arrangement direction of the red sub-pixel (region) 303 is substantially parallel to the arrangement direction of the red sub-pixel (region) 305. That is, the extension line of the long direction of the red sub-pixel (region) 301 is substantially parallel to the extension line of the long direction of the red sub-pixel (region) 307, and the extension line of the long direction of the red sub-pixel (region) 303 is substantially parallel to the extension line of the long direction of the red sub-pixel (region) 305. Furthermore, the red sub-pixel(s) (regions) 303 and 305 with the same color are adjacent disposed to increase the aperture ratio.

From the pixel group G point of view, since the arrangement and details of the pixel group G of FIG. 7A are the same as that of FIG. 1A, which can be viewed aforementioned, and, therefore, a description in this regard will not be repeated hereinafter.

Figure 8A:
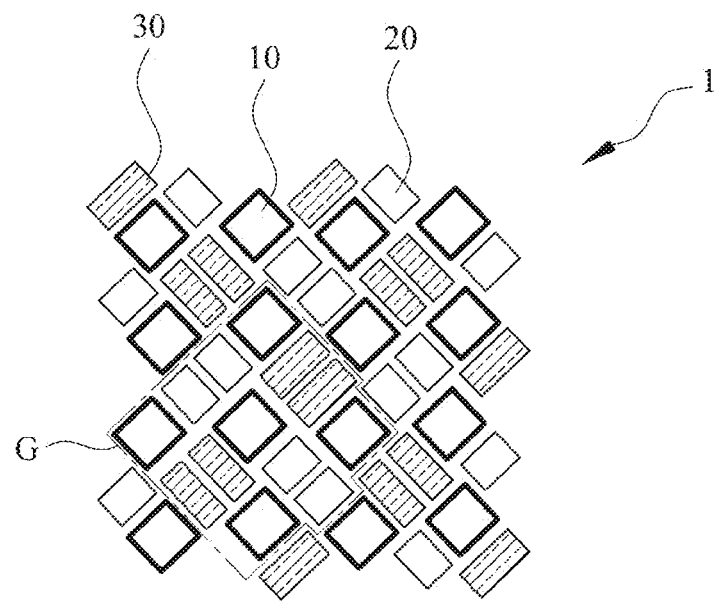
FIG. 8A is a schematic diagram of a pixel array of FIG. 1A according to another alternatively embodiment of the present disclosure.
Figure 8B:
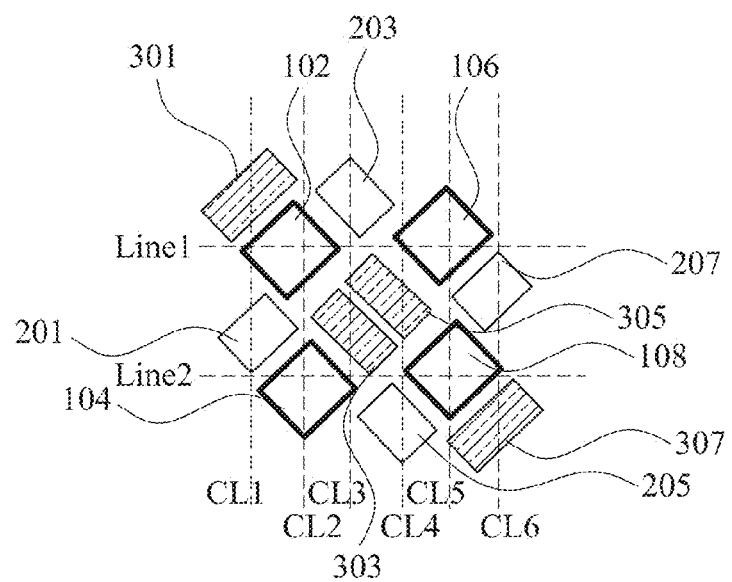
FIG. 8B is a schematic diagram of a single sub-pixel matrix of the pixel array of FIG. 8A.

FIG. 8A is a schematic diagram of a pixel array 1 of FIG. 1A according to another alternatively embodiment of the present disclosure, and FIG. 8B is a schematic diagram of a single sub-pixel matrix of the pixel array 1 of FIG. 8A. The difference between the embodiment of FIGS. 7A and 7B and the embodiment of FIGS. 1A and 1B pertains to the position switching between all of the blue sub-pixel(s) (regions) and the red sub-pixel(s) (regions) of the sub-pixel matrix. For the convenience of description, a description in this regard will not be repeated hereinafter.

Figure 8C:
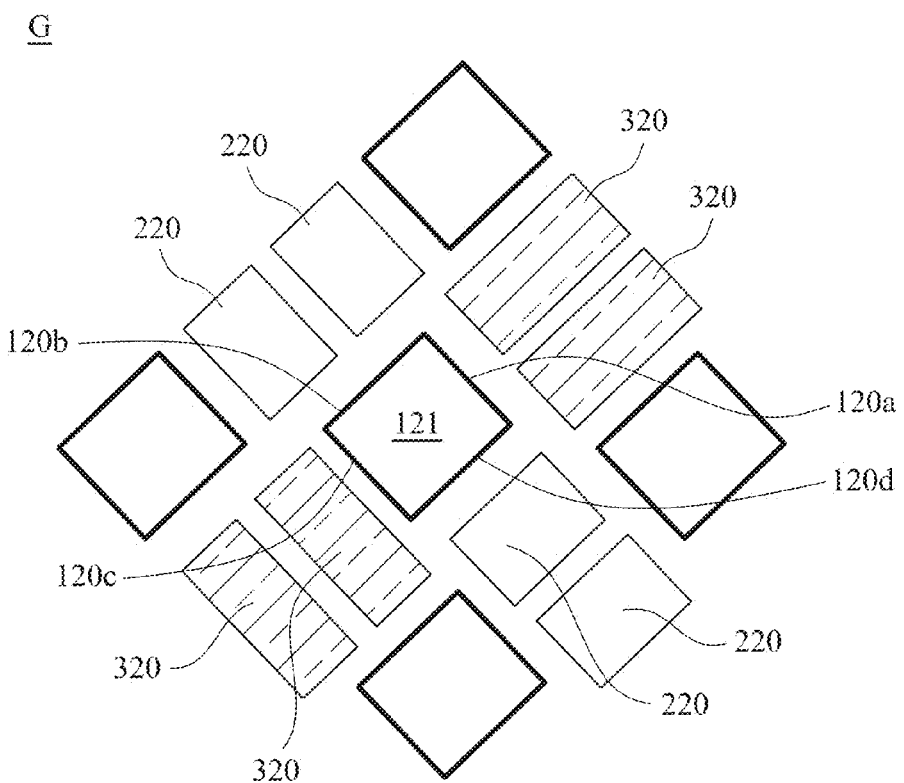
FIG. 8C is a schematic diagram of the single pixel group of the pixel array of FIG. 8A.

From the pixel group G point of view, reference is made to FIG. 8C which is a schematic diagram of the single pixel group G of the pixel array 1 of FIG. 8A. In this embodiment, the red sub-pixel(s) (regions) 320 are the first sub-pixel(s) (regions), i.e., the red sub-pixel(s) (regions) are disposed at the first side 120a and the third side 120c of the brightness sub-pixel (region) 121. The blue sub-pixel(s) (regions) 220 are the second sub-pixel(s) (regions), i.e., the blue sub-pixel(s) (regions) 220 are disposed at the second side 120b and the fourth side 120d of the brightness sub-pixel (region) 121. Moreover, since the arrangement and details of the pixel group G of FIG. 8C are the same as that of FIG. 1C, which can be viewed aforementioned, and, therefore, a description in this regard will not be repeated hereinafter.

Figure 9A:
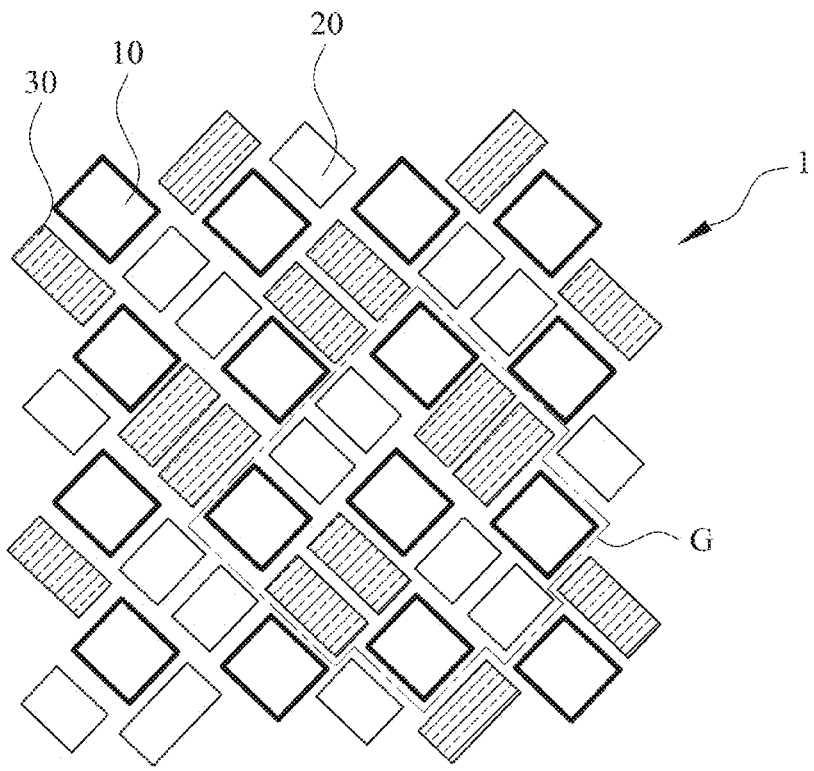
FIG. 9A is a schematic diagram of a pixel array of FIG. 1A according to an alternatively embodiment of the present disclosure.
Figure 9B:
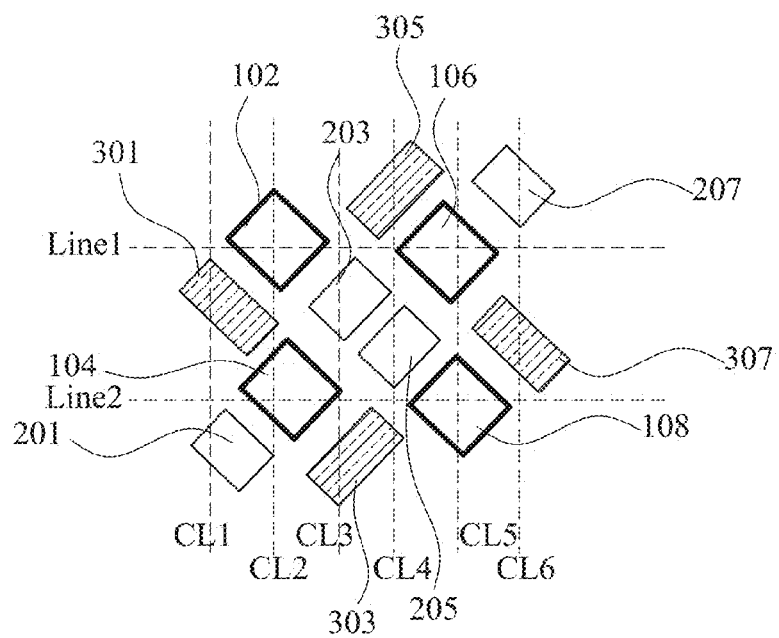
FIG. 9B is a schematic diagram of a single sub-pixel matrix of the pixel array of FIG. 9A.

FIG. 9A is a schematic diagram of a pixel array 1 of FIG. 1A according to an alternatively embodiment of the present invention, and FIG. 9B is a schematic diagram of a single sub-pixel matrix of the pixel array 1 of FIG. 9A. The difference between the embodiment of FIGS. 9A and 9B and the embodiment of FIGS. 8A and 8B pertains to the positions of the blue sub-pixel(s) (regions) 20 and the red sub-pixel(s) (regions) 30, and the difference between the embodiment of FIGS. 9A and 9B and the embodiment of FIGS. 7A and 7B pertains to the position switching between all of the blue sub-pixel(s) (regions) 20 and the red sub-pixel(s) (regions) 30 of the sub-pixel matrix. For the convenience of description, a description in this regard will not be repeated hereinafter. From the pixel group G point of view, since the arrangement and details of the pixel group G of FIG. 9A are the same as that of FIG. 8C, which can be viewed aforementioned, and, therefore, a description in this regard will not be repeated hereinafter.

Figure 10A:
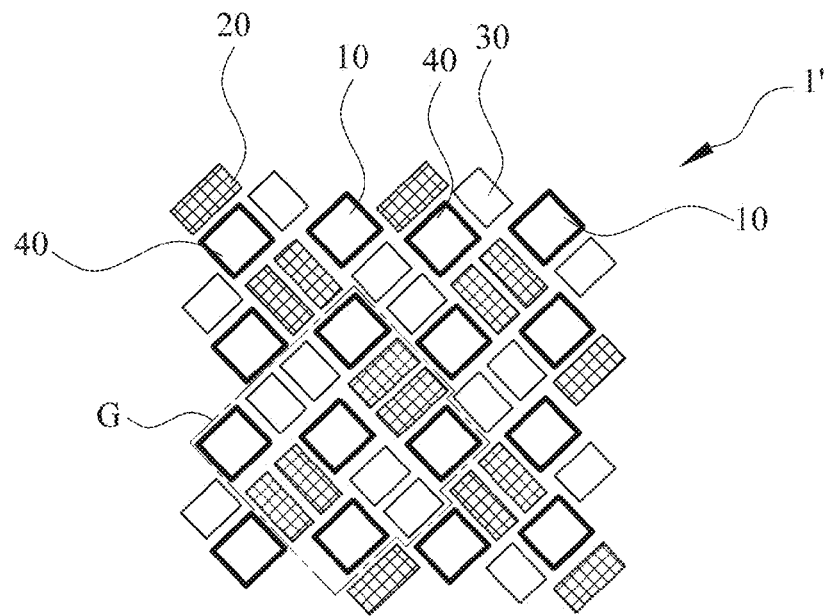
FIG. 10A is a schematic diagram of a pixel array of the display panel according to another embodiment of the present disclosure.
Figure 10B:
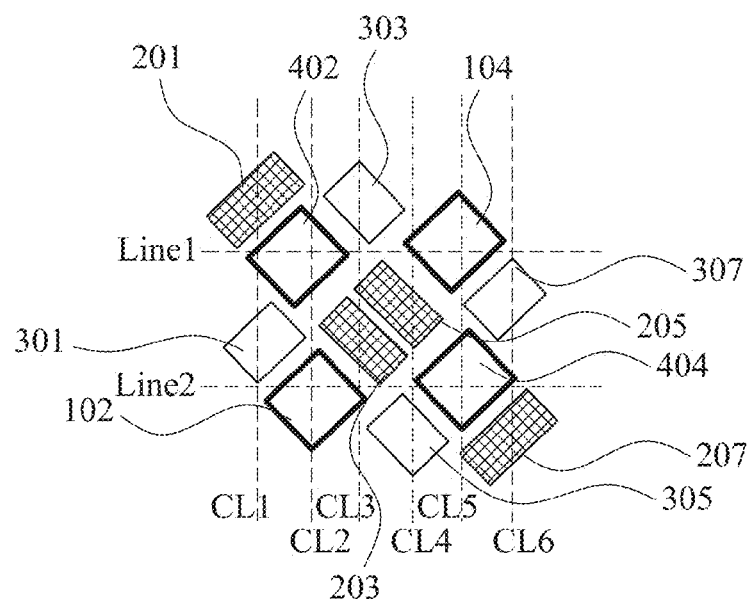
FIG. 10B is a schematic diagram of a single sub-pixel matrix of the pixel array of FIG. 10A.

FIG. 10A is a schematic diagram of a pixel array 1' of the display panel according to another embodiment of the present invention, and FIG. 10B is a schematic diagram of a single sub-pixel matrix of the pixel array 1' of FIG. 10A. The difference between the embodiment of FIGS. 10A and 10B and the embodiment of FIGS. 1A and 1B pertains to the type of the brightness sub-pixel(s) (regions) 10, 40. Rather than just the green sub-pixel(s) (regions), the brightness sub-pixel(s) (regions) 10, 40 in this embodiment include yellow sub-pixel(s) (regions) corresponding to the brightness sub-pixel(s) (regions) 40 and green sub-pixel(s) (regions) corresponding to the brightness sub-pixel(s) (regions) 10. The yellow sub-pixel(s) (regions) and the green sub-pixel(s) (regions) are alternately arranged and distributed in the pixel array 1'. The including of the yellow sub-pixel(s) (regions) can increase the display color saturation and reduce power consumption.

As shown in FIG. 10B, the yellow sub-pixel (region) 402 and the green sub-pixel (region) 102 are sequentially arranged at the second column CL2, and the green sub-pixel (region) 104 and the yellow sub-pixel (region) 404 are sequentially arranged at the fifth column CL5. That is, the yellow sub-pixel (region) 402 and the green sub-pixel (region) 104 are alternately arranged at the first row Line1, and the green sub-pixel (region) 102 and the yellow sub-pixel (region) 404 are alternately arranged at the second row Line 2.

Figure 10C:
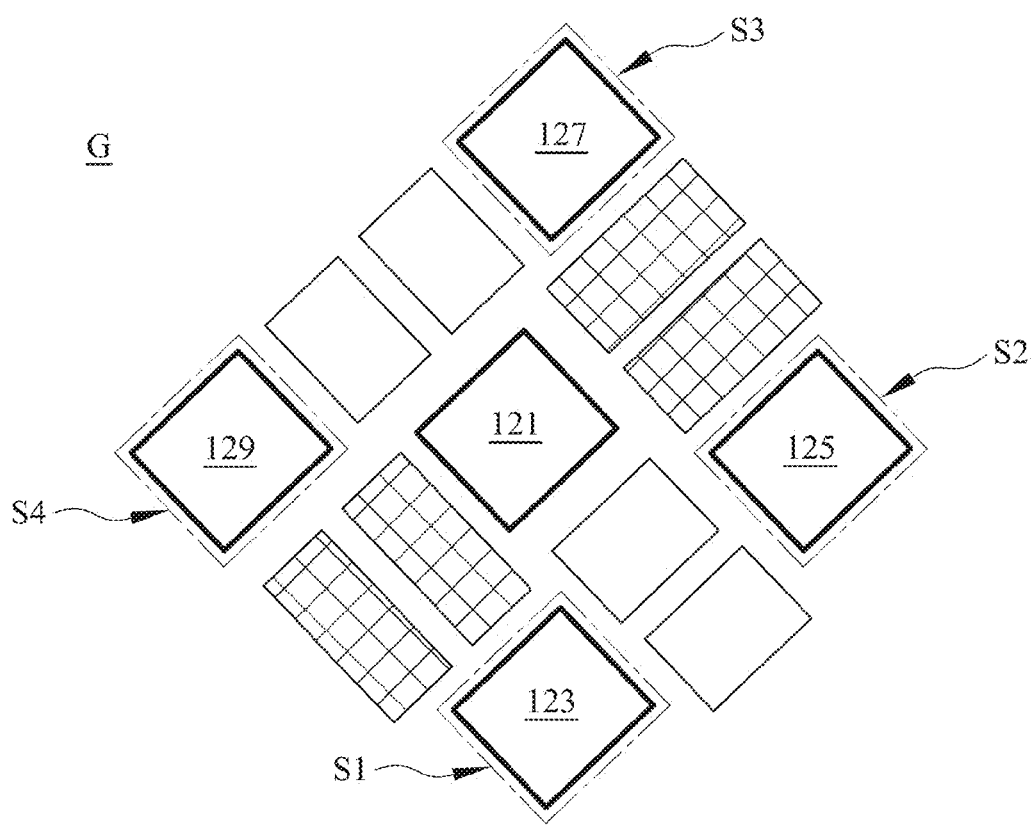
FIG. 10C is a schematic diagram of the single pixel group of the pixel array of FIG. 10A.

From the pixel group G point of view, reference is made to FIG. 10C which is a schematic diagram of the single pixel group G of the pixel array 1' of FIG. 10A. In this embodiment, the first brightness sub-pixel (region) 121 is green, the second brightness sub-pixel (region) 123 disposed in the first accommodating space S1, the third brightness sub-pixel (region) 125 disposed in the second accommodating space S2, the fourth brightness sub-pixel (region) 127 disposed in the third accommodating space S3, and the fifth brightness sub-pixel (region) 129 disposed in the fourth accommodating space S4 are all yellow. Alternatively, the first brightness sub-pixel (region) 121 is yellow, the second brightness sub-pixel (region) 123 disposed in the first accommodating space S1, the third brightness sub-pixel (region) 125 disposed in the second accommodating space S2, the fourth brightness sub-pixel (region) 127 disposed in the third accommodating space S3, and the fifth brightness sub-pixel (region) 129 disposed in the fourth accommodating space S4 are all green. In other embodiments, the yellow sub-pixel(s) (regions) can be replaced to be white sub-pixel(s) (regions). Other details of the pixel group G of FIG. 10C are the same as that of FIG. 1C, which can be viewed aforementioned, and, therefore, a description in this regard will not be repeated hereinafter.

In other embodiments, the arrangements of the brightness sub-pixel(s) (regions) 10 of the pixel array 1 of FIGS. 7A, 8A, and 9A can be replaced to be the arrangement of the brightness sub-pixel(s) (regions) 10, 40 of FIG. 10A. That is, the brightness sub-pixel(s) (regions) of the pixel array 1 of FIGS. 7A, 8A, and 9A can include green sub-pixel(s) (regions) and yellow sub-pixel(s) (regions), or include green sub-pixel(s) (regions) and white sub-pixel(s) (regions).

Figure 11A:
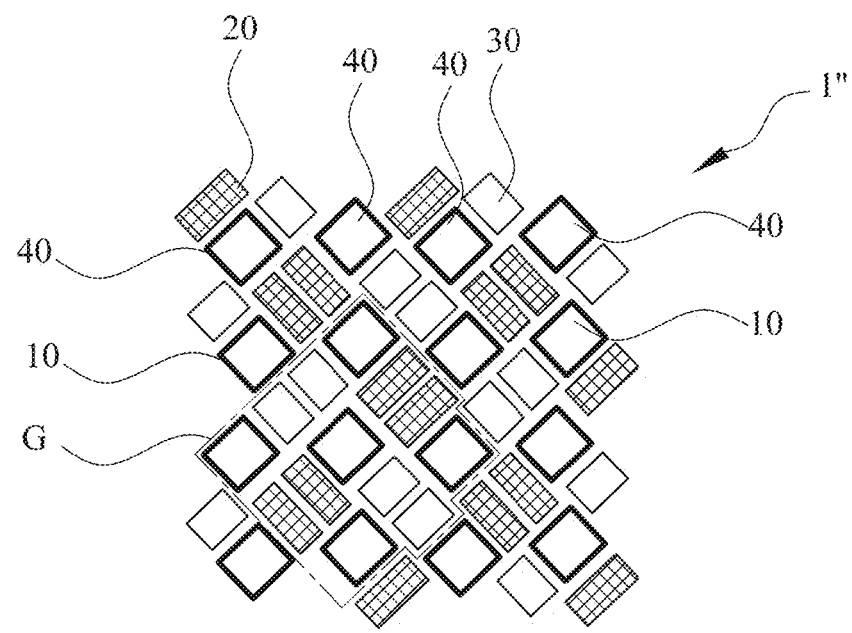
FIG. 11A is a schematic diagram of a pixel array of the display panel according to still another embodiment of the present disclosure.
Figure 11B:
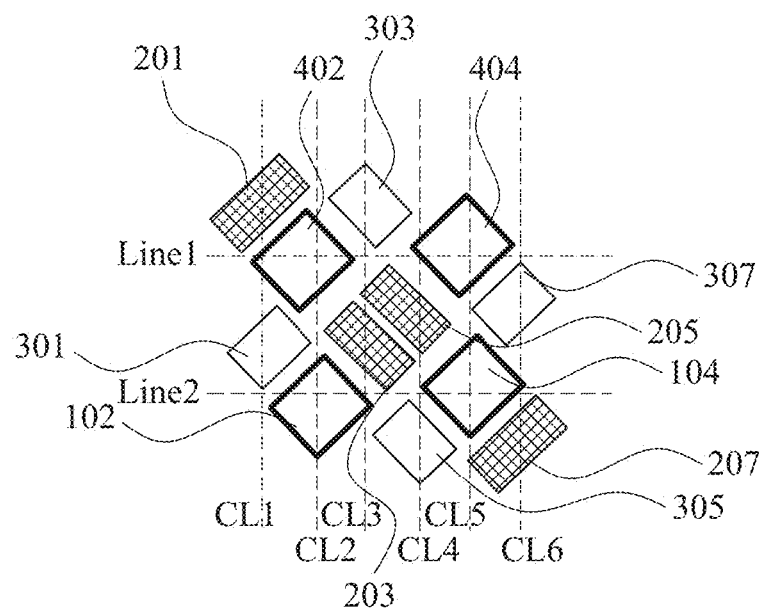
FIG. 11B is a schematic diagram of a single sub-pixel matrix of the pixel array of FIG. 11A.

FIG. 11A is a schematic diagram of a pixel array 1" of the display panel according to still another embodiment of the present invention, and FIG. 11B is a schematic diagram of a single sub-pixel matrix of the pixel array 1" of FIG. 11A. The difference between the embodiment of FIGS. 11A and 11B and the embodiment of FIGS. 10A and 10B pertains to the arrangement of the brightness sub-pixel(s) (regions). In this embodiment, the brightness sub-pixel(s) (regions) with the same color are uniformly distributed in the same rows. As shown in FIG. 10B, the green sub-pixel (region) at the first row Line1 and the fifth column CL5 is replaced to be the yellow sub-pixel (region) 404, and the yellow sub-pixel (region) at the second row Line2 and the fifth column CL5 is replaced to be the green sub-pixel (region) 104.

Figure 11C:
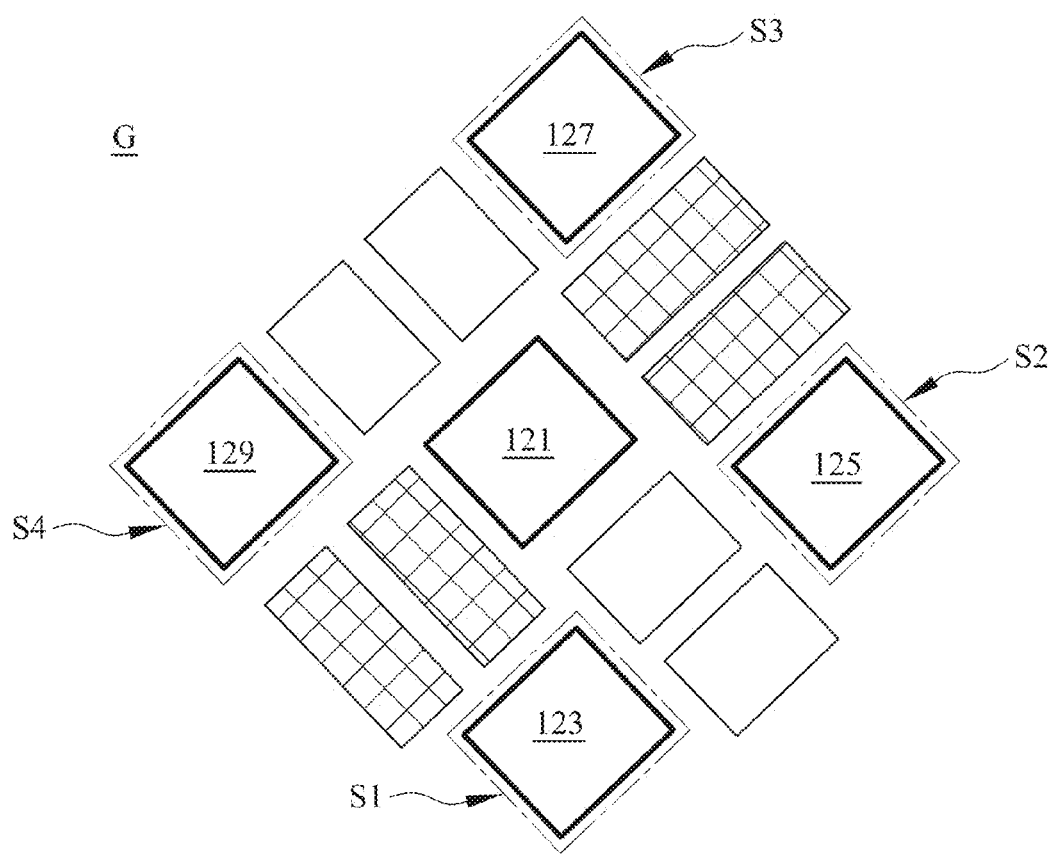
FIG. 11C is a schematic diagram of the single pixel group of the pixel array of FIG. 11A.

From the pixel group G point of view, reference is made to FIG. 11C which is a schematic diagram of the single pixel group G of the pixel array 1" of FIG. 11A. In this embodiment, the first brightness sub-pixel (region) 121, the third brightness sub-pixel (region) 125 disposed in the second accommodating space S2, and the fifth brightness sub-pixel (region) 129 disposed in the fourth accommodating space S4 are all green, and the second brightness sub-pixel (region) 123 disposed in the first accommodating space S1 and the fourth brightness sub-pixel (region) 127 disposed in the third accommodating space S3 are both yellow. Alternatively, the first brightness sub-pixel (region) 121, the third brightness sub-pixel (region) 125 disposed in the second accommodating space S2, and the fifth brightness sub-pixel (region) 129 disposed in the fourth accommodating space S4 are all yellow, and the second brightness sub-pixel (region) 123 disposed in the first accommodating space S1 and the fourth brightness sub-pixel (region) 127 disposed in the third accommodating space S3 are both green. In other embodiments, the yellow sub-pixel(s) (regions) can be replaced to be white sub-pixel(s) (regions), and the claimed scope is not limited in this respect. Other details of the pixel group G of FIG. 11C are the same as that of FIG. 1C, which can be viewed aforementioned, and, therefore, a description in this regard will not be repeated hereinafter.

In other embodiments, the arrangements of the brightness sub-pixel(s) (regions) 10 of the pixel array 1 of FIGS. 7A, 8A, and 9A can be replaced to be the arrangement of the brightness sub-pixel(s) (regions) 10, 40 of FIG. 11A. That is, the brightness sub-pixel(s) (regions) of the pixel array 1 of FIGS. 7A, 8A, and 9A can include green sub-pixel(s) (regions) and yellow sub-pixel(s) (regions), or include green sub-pixel(s) (regions) and white sub-pixel(s) (regions).

In summary, the display panel of the present invention has the pixel array including a plurality of 2×6 sub-pixel matrixes. Each of the sub-pixel matrixes includes four brightness sub-pixel(s) (regions), four first sub-pixel(s) (regions), and four sub-pixel(s) (regions). All of the first sub-pixel(s) (regions) and the second sub-pixel(s) (regions) are disposed around the brightness sub-pixel(s) (regions), and the first sub-pixel(s) (regions) and the second sub-pixel(s) (regions) are respectively disposed at two adjacent sides of the corresponding brightness sub-pixel(s) (regions). Or, there are five brightness sub-pixel(s) (regions). All of the first sub-pixel(s) (regions) and the second sub-pixel(s) (regions) are disposed around the brightness sub-pixel(s) (regions), and the first sub-pixel(s) (regions) and the second sub-pixel(s) (regions) are respectively disposed at two adjacent sides of the corresponding brightness sub-pixel(s) (regions). Furthermore, the arrangement of the sub-pixel(s) (regions) is non-parallel to and non-orthogonal to the vertical and the horizontal baselines, for example the arrangement of the sub-pixel(s) (regions) is obliquely arrangement. Compare with the related art, the brightness sub-pixel(s) (regions) of the embodiments of the present disclosure are uniformly distributed to achieve a good display quality. The arrangements mentioned above not only can overcome the manufacturing difficulties, but also can increase the aperture ratio. Furthermore, the brightness sub-pixel(s) (regions) can be a combination of green sub-pixel(s) (regions) and yellow or white sub-pixel(s) (regions), which may improve display color saturation while also reducing power consumption.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the invention. In view of the foregoing, it is intended that the present invention cover modifications and variations of this invention provided they fall within the scope of the following claims.

What is claimed is:

1. A display panel having a pixel array, the pixel array of the display panel comprising a plurality of 2×6 sub-pixel matrixes, each of the sub-pixel matrixes comprising four brightness sub-pixels, four first sub-pixels $P_{11}$~$P_{14}$, and four second sub-pixels $P_{21}$~$P_{24}$, in the sub-pixel matrixes:
   a first column sequentially comprising the first sub-pixel $P_{11}$ and the second sub-pixel $P_{21}$;
   a second column sequentially comprising the first brightness sub-pixel and the second brightness sub-pixel;
   a third column sequentially comprising the second sub-pixel $P_{22}$ and the first sub-pixel $P_{12}$;
   a fourth column sequentially comprising the first sub-pixel $P_{13}$ and the second sub-pixel $P_{23}$;
   a fifth column sequentially comprising the third brightness sub-pixel and the fourth brightness sub-pixel; and
   a sixth column sequentially comprising the second sub-pixel $P_{24}$ and the first sub-pixel $P_{14}$;
   wherein all of the first sub-pixels and the second sub-pixels are disposed around the brightness sub-pixels, and the first sub-pixels and the second sub-pixels are respectively disposed at two adjacent sides of the brightness sub-pixels.

2. The display panel of claim 1, wherein each the brightness sub-pixels is a green sub-pixel.

3. The display panel of claim 1, wherein the brightness sub-pixels comprise yellow sub-pixels and green sub-pixels, and the brightness sub-pixels with the same color are disposed at different columns and the same row, or at different columns and different rows.

4. The display panel of claim 3, wherein the first brightness sub-pixels and the fourth brightness sub-pixels are the yellow sub-pixels, and the second brightness sub-pixels and the third brightness sub-pixels are the green sub-pixels.

5. The display panel of claim 3, wherein the first brightness sub-pixels and the third brightness sub-pixels are the yellow sub-pixels, and the second brightness sub-pixels and the fourth brightness sub-pixels are the green sub-pixels.

6. The display panel of claim 1, wherein the first sub-pixels are blue sub-pixels, and the second sub-pixels are red sub-pixels.

7. The display panel of claim 1, wherein the first sub-pixels are red sub-pixels, and the second sub-pixels are blue sub-pixels.

8. The display panel of claim 1, wherein an arrangement direction of the first sub-pixel $P_{11}$ is substantially orthogonal to an arrangement direction of the first sub-pixel $P_{12}$, an arrangement direction of the first sub-pixel $P_{13}$ is substantially orthogonal to an arrangement direction of the first sub-pixel $P_{14}$, and the arrangement direction of the first sub-pixel $P_{11}$ is substantially parallel to the arrangement direction of the first sub-pixel $P_{14}$.

9. The display panel of claim 1, wherein an arrangement direction of the second sub-pixel $P_{21}$ is substantially orthogonal to an arrangement direction of the second sub-pixel $P_{22}$, an arrangement direction of the second sub-pixel $P_{23}$ is substantially orthogonal to an arrangement direction of the second sub-pixel $P_{24}$, and the arrangement direction of the second sub-pixel $P_{21}$ is substantially parallel to the arrangement direction of the second sub-pixel $P_{24}$.

10. The display panel of claim 1, wherein the display panel is an organic light emitting diode display.

11. A pixel array, comprising:
a plurality of pixel groups, each of the pixel groups at least comprising:
a plurality of brightness sub-pixel regions, at least comprising five of the brightness sub-pixel regions, and each of the brightness sub-pixel regions having a first side, a second side, a third side, and a fourth side;
a plurality of first sub-pixel regions, at least comprising a first group and a second group, each of the first sub-pixel regions at least having a long direction and a short direction, wherein the first group is disposed at the first side of a first brightness sub-pixel region, the second group is disposed at the third side of the first brightness sub-pixel region, an extension line of the long direction of the first group interlaces a vertical baseline at a first angle $\theta 1$, and an extension line of the long direction of the second group interlaces the vertical baseline at a second angle $\theta 2$, wherein the vertical baseline is perpendicular to a horizontal baseline; and
a plurality of second sub-pixel regions, at least comprising a third group and a fourth group, each of the second sub-pixel regions at least having a long direction and a short direction, wherein the third group is disposed at the second side of the first brightness sub-pixel region, the fourth group is disposed at the fourth side of the first brightness sub-pixel region, an extension line of the long direction of the third group interlaces the vertical baseline at a third angle $\theta 3$, and an extension line of the long direction of the fourth group interlaces the vertical baseline at a fourth angle $\theta 4$, wherein $0°<\theta 1<90°$, $0°<\theta 2<90°$, $0°<\theta 3<90°$, and $0°<\theta 4<90°$, a first accommodating space is formed between the second group and the fourth group, a second accommodating space is formed between the first group and the fourth group, a third accommodating space is formed between the first group and the third group, and a fourth accommodating space is formed between the third group and the second group, wherein the second brightness sub-pixel region is disposed in the first accommodating space, the third brightness sub-pixel region is disposed in the second accommodating space, the fourth brightness sub-pixel region is disposed in the third accommodating space, and the fifth brightness sub-pixel region is disposed in the fourth accommodating space.

12. The pixel array of claim 11, wherein a centroid connecting line between the second brightness sub-pixel region disposed in the first accommodating space and the third brightness sub-pixel region disposed in the second accommodating space interlaces the vertical baseline at a fifth angle $\theta 5$, and $0°<\theta 5<90°$.

13. The pixel array of claim 11, wherein a centroid connecting line between the fourth brightness sub-pixel region disposed in the third accommodating space and the fifth brightness sub-pixel region disposed in the fourth accommodating space interlaces the vertical baseline at a sixth angle $\theta 6$, and $0°<\theta 6<90°$.

14. The pixel array of claim 11, wherein an extension direction of a centroid connecting line among the first brightness sub-pixel region, the second brightness sub-pixel region disposed in the first accommodating space, and the fourth brightness sub-pixel region disposed in the third accommodating space is substantially parallel to the vertical baseline.

15. The pixel array of claim 11, wherein an extension direction of a centroid connecting line among the first brightness sub-pixel region, the third brightness sub-pixel region disposed in the second accommodating space, and the fifth brightness sub-pixel region disposed in the fourth accommodating space is substantially parallel to the horizontal baseline.

16. The pixel array of claim 11, wherein there is no other brightness sub-pixel region disposed between any two adjacent of the five brightness sub-pixel regions.

17. The pixel array of claim 11, wherein the five brightness sub-pixel regions are all green.

18. The pixel array of claim 11, wherein the first brightness sub-pixel region, the third brightness sub-pixel region disposed in the second accommodating space, and the fifth brightness sub-pixel region disposed in the fourth accommodating space are all green, and the second brightness sub-pixel region disposed in the first accommodating space and the fourth brightness sub-pixel region disposed in the third accommodating space are both yellow or white.

19. The pixel array of claim 11, wherein the first group and the second group at least respectively comprise one of the first sub-pixel regions, and the third group and the fourth group at least respectively comprise two immediately adjacent of the second sub-pixel regions.

20. The pixel array of claim 11, wherein the first group and the second group at least respectively comprise two immediately adjacent of the first sub-pixel regions, and the third group and the fourth group at least respectively comprise two immediately adjacent of the second sub-pixel regions.

* * * * *